United States Patent [19]

Tyson

[11] Patent Number: 5,128,733
[45] Date of Patent: Jul. 7, 1992

[54] SILICON MESA TRANSISTOR STRUCTURE

[75] Inventor: Scott M. Tyson, Colorado Springs, Colo.

[73] Assignee: United Technologies Corporation, Hartford, Conn.

[21] Appl. No.: 701,738

[22] Filed: May 17, 1991

[51] Int. Cl.⁵ .................. H01L 27/01; H01L 27/12; H01L 29/34
[52] U.S. Cl. ...................... 357/23.7; 357/4; 357/59; 357/54
[58] Field of Search .............. 357/23.7, 4, 59 E

[56] References Cited

U.S. PATENT DOCUMENTS

| | | | |
|---|---|---|---|
| 4,974,051 | 11/1990 | Matloubian et al. | 357/23.7 |
| 5,001,528 | 3/1991 | Bahraman | 357/4 |
| 5,012,311 | 4/1991 | Shirato | 357/4 |
| 5,037,781 | 8/1991 | Woodruff et al. | 437/245 |

Primary Examiner—Rolf Hille
Assistant Examiner—Robert Limanek

[57] ABSTRACT

A silicon on insulator transistor employs a thick field insulator overlapping silicon mesas, the overlap area beneath the interface between the transistor gate and the sidewall being doped to increase the threshold for parasitic transistors above that of the transistor.

2 Claims, 3 Drawing Sheets

SILICON MESA TRANSISTOR STRUCTURE

DESCRIPTION

1. Technical Field

The field of the invention is that of silicon on insulator (SOI) integrated circuit processing, in which transistors are formed on isolated silicon mesas above a buried oxide layer.

2. Background Art

In the art of silicon mesa integrated circuits, there has been a problem with parasitic leakages at the edges of the silicon mesa. Charge may be trapped by the effect of ionizing radiation or during processing and may give rise to inversion in the areas of the associated parasitic transistors. Additionally, current leakage paths may be formed from one electrode or wire to another, such as from the source to the drain of a transistor.

In the art of bulk silicon circuits, there has been used a multi-layer field insulator structure as shown in copending U.S. patent application Ser. No. 7/220,764 and incorporated by reference herein. This field insulator employed a lower layer of thermal oxide grown on the silicon substrate and two additional layers.

DISCLOSURE OF INVENTION

The invention relates to an improved silicon mesa structure in which a field insulator is made to overlap the mesa structure by a predetermined amount together with processing of the mesa underneath the field insulator structure.

Other features and advantages will be apparent from the specification and claims and from the accompanying drawings which illustrate an embodiment of the invention.

BEST MODE FOR CARRYING OUT THE INVENTION

Figure 1:
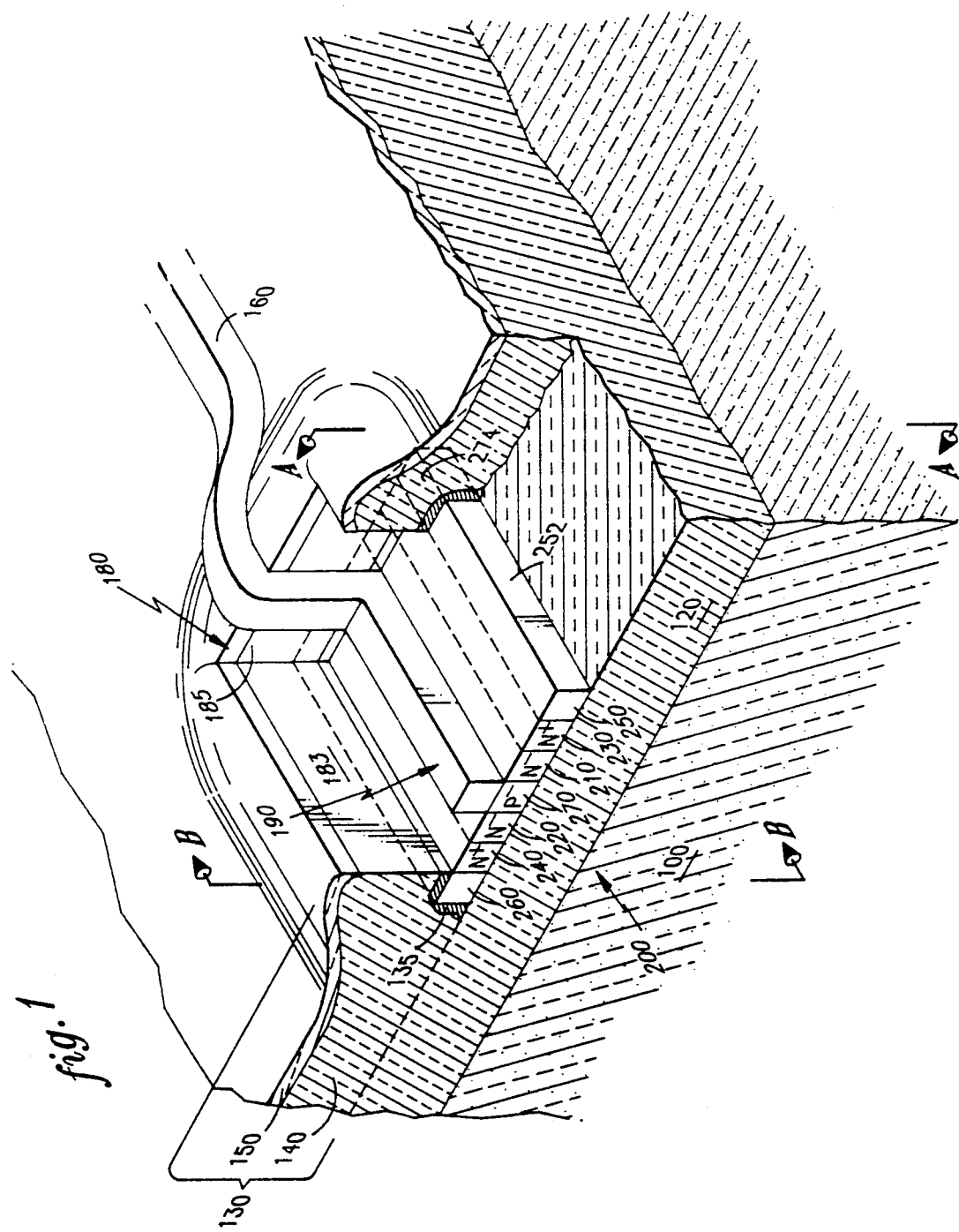
FIG. 1 illustrates in perspective a mesa and transistor constructed according to the invention.

Referring now to FIG. 1, there is shown in perspective a silicon mesa, referred to by the numeral 200, resting on a buried oxide layer 120 that is formed within a substrate 100 and exposed by earlier processing in a silicon on insulator (SOI) wafer. A preferred field oxide structure (disclosed in copending U.S. patent application Ser. No. 7,220,764 and incorporated herein by reference) referred to by the collective numeral 130 and comprising a layer of a thermal (sometimes referred to as dry) oxide 135, a deposited boron phospho-silicate glass layer 140 and a deposited oxide layer 150 is put down over the entire wafer. Thermal oxide layer 135 will be relatively thicker over mesa 200, since oxide layer 120 has a smaller proportion of unreacted silicon than mesa 200. Other field insulators may be used as appropriate for different circumstances. An aperture 180, sometimes referred to as the active cut, is opened up in layer 130 of a size such that the field structure 130 overlaps the mesa in an overlap area This aperture will define the active area for transistor fabrication. In a later processing step, a gate oxide will be grown within the aperture. Within mesa 200, two regions 250 and 260 are shown on the right and left edges, respectively, as being in the overlap area covered by insulator 130. A polysilicon strip 160 enters from the upper right of the drawing, descends into aperture 180 and forms the gate of a field effect transistor 190 formed within mesa 200 and having a channel 270, bracketed by the source and drain. The lightly doped source and drain areas are denoted by numerals 220 and 210 respectively. The heavily doped portions of the source and drain are denoted by numerals 240 and 230, respectively. Cross sections are taken along lines A—A and B—B to show this device in more detail.

Figure 2:
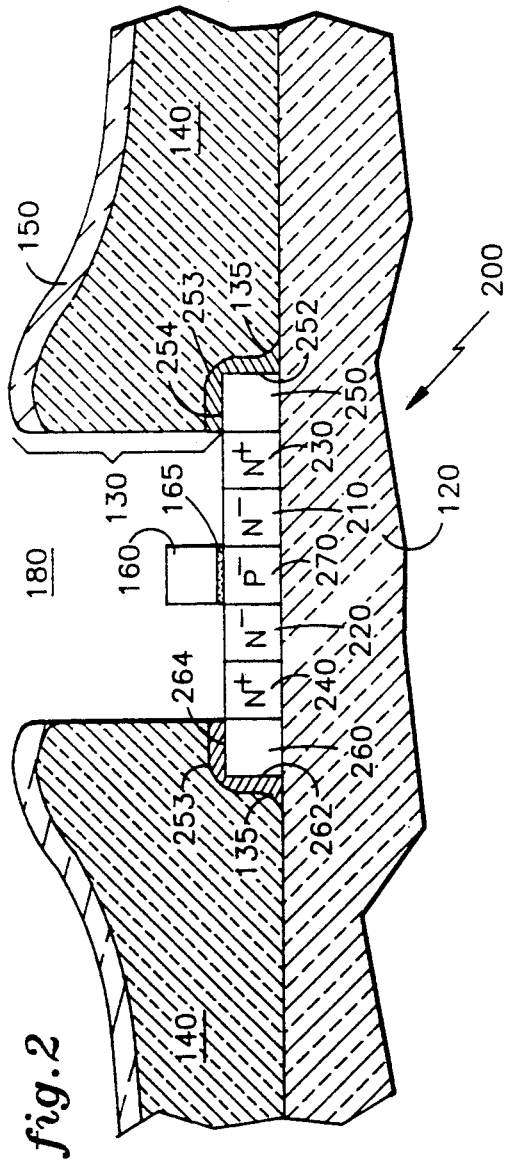
FIGS. 2 and 3 illustrate cross sections of FIG. 1.

Referring now to FIG. 2, there is shown cross section A—A taken perpendicular to the axis of polysilicon (poly) gate 160. Poly gate 160 is separated from a channel 270 by gate oxide 165 that will be described in more detail below. Preferably, gate oxide 165 is grown separately from oxide 135, to avoid contamination from intermediate steps between the time layer 135 is grown and the time layer 165 is grown. At the left and right edges, thermal oxide layer 135 of field insulator 130 rises up and over the portions 260 and 250 of mesa 200. In the prior art, the vertical edges of aperture 180 were beyond the edge of mesa 200, separated from it by tolerance variations. In the past, the thermal, or gate oxide extended up the mesa sidewalls 262 and 252, and over the overlap area surfaces 264 and 254, so that there was a problem of electrical breakdown between the poly conductor that formed the gate or a poly interconnection and a conductor, such as a source or drain in mesa 200, at the corners 253 of the mesa where oxide 135 was thinner and the field strengths higher.

Figure 3:
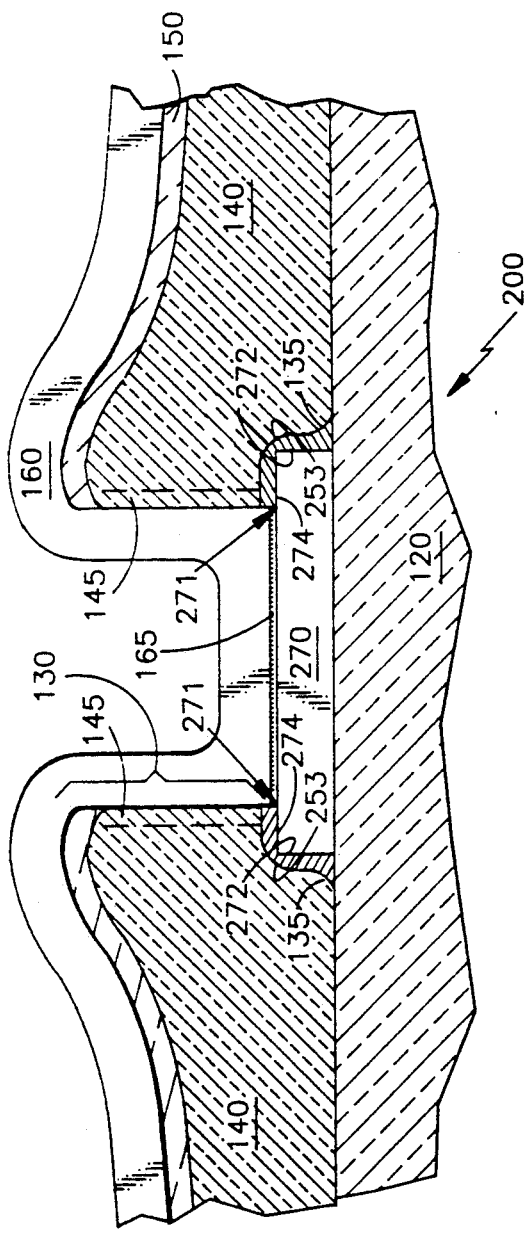

Referring now to FIG. 3, there is shown a cross section B-B taken along the axis of polysilicon gate 160. Gate oxide 165 lies below gate 160 and thermal oxide 135 extends under field structure 130 and along both vertical edges 272 of mesa 200. Two areas on the left and right of the mesa denoted by the numerals 274, are the overlap areas corresponding to areas in FIG. 2. Corners 271 are the corners where the bottom of field structure 130 meets mesa 200. The potential current paths referred to above are along mesa faces 272, overlap area surfaces 274, or along corners 271. The potential breakdown between poly 160 and the mesa corners 253 is no longer a problem, since the full thickness of the field insulator is now between the poly and the corners 253. If charge is trapped in field structure 130, there is a danger that these potential charge paths may become actual paths and that current may flow along one or more of them between the source and drain of the transistor through the channel of a parasitic field effect transistor that has been turned on by the field from the trapped charge. Such a channel will have a threshold in electric field or voltage below which the channel does not conduct and above which it does conduct. The art attacks the problem by reducing trapping sites in sensitive geometric areas, such as along the top or side of a mesa between the source and drain of a transistor and/or by raising the voltage threshold of the parasitic device for current flow. There is little point in making the threshold voltage greater than the threshold voltage of the intended transistor. If the field insulation is clean enough, so that very little charge is trapped, the conventional processing of the mesa may be sufficient for some purposes.

Figure 4:
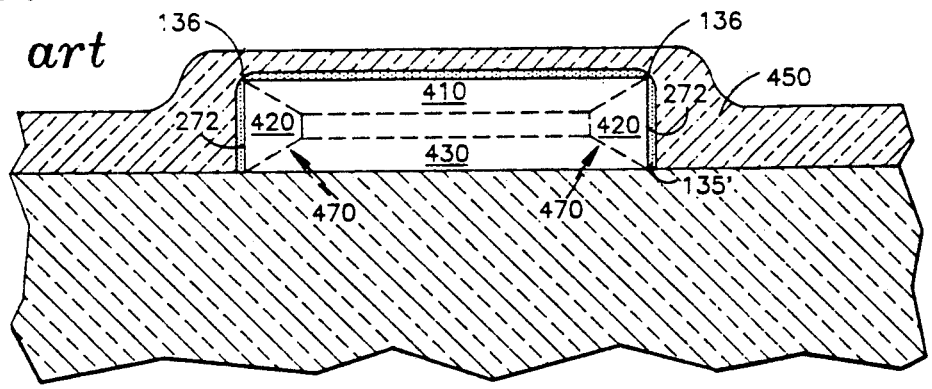
FIG. 4 illustrates a cross section of a prior art mesa.
Figure 5:
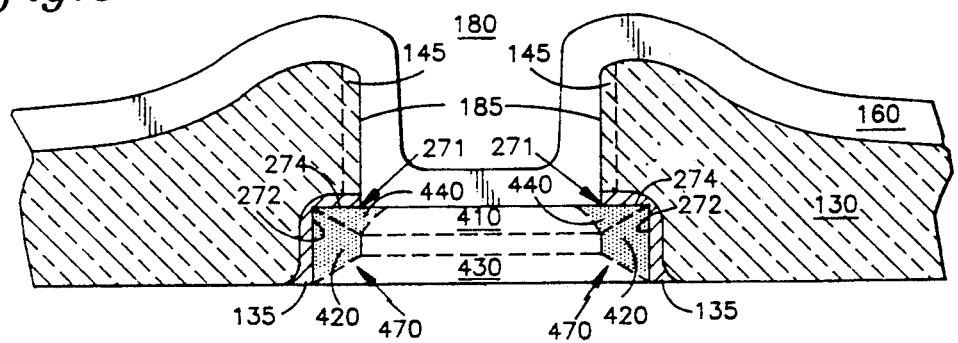
FIG. 5 illustrates a cross section of a mesa constructed according to the invention.

Referring to FIG. 4, there is shown an enlarged view of mesa 200 through cross section B—B. Polysilicon strip 450 is the gate electrode, with oxide 135 being the gate oxide. An area 410 on the top of the mesa that is the intended channel of the transistor. Behind the right and left faces 272, there are two parasitic channels 420, that are caused by sidewall inversion, caused by charge from exposure to ionizing radiation being collected within the portion of oxide 135 facing sides 272 of the mesa. At the bottom of mesa 200 there is a back channel 430. Referring next to FIG. 5, there is shown a counterpart cross section for a transistor according to the invention. Below the walls 185 of aperture 180, there are additional regions labelled 440 that may be channels formed by charge collected at the corner 271 between sidewall 185 and mesa 200 or within the portion of oxide 135 facing the top surface 274. These areas 440 are formed on the top surface 274 of mesa 200 at the base of sidewall 185 where it is in contact with poly 160. Any of these sections, 420, 430, or 440 can give rise to a parasitic transistor and/or a current leakage path perpendicular to the plane of the paper.

Areas 440 and 420 below the overlap areas 274 are speckled to indicate the presence of an ion implant dose. This implant, which is preferably performed before the field insulator structure is put down, is used to eliminate the possibility of current flow perpendicular to the plane of the paper through a parasitic transistor channel in region 420 or 440 by raising the inversion threshold of the potential current paths. The implant could be performed after one or more layers of insulator 130 are put down, by using a higher accelerating voltage and tolerating more scatter. The magnitude of the implant dose is set to cause the final threshold voltage in operation of the corresponding parasitic transistors to be greater than the threshold voltage of transistor 190. If the thickness of mesa 200 warrants, the implant energy may be varied from a low energy of 40 keV for $BF_2$ implantation into P-well sidewalls to ensure that surface 274 has the correct implant dose to a greater energy set to put the peak of the ion distribution deep enough in mesa 200 that the sidewall channels 420 on surfaces 272 are reasonably uniformly covered. For a mesa thickness of approximately 1500 Å the energies were set to put the ion distribution peaks $\frac{1}{3}$ and $\frac{2}{3}$ of the way through the mesa. Thicker mesas will require multiple energy distributions to get a uniform concentration. The energy may be varied continuously in a single step or several steps of discrete energies may be used. The implant distribution extends out past the edge of the mesa with sufficient tolerance for misalignment to ensure that surfaces 272 have their thresholds set as well as surfaces 274. The mesas of both N- and P-channel transistors will with suitable species be implanted.

Figure 6:
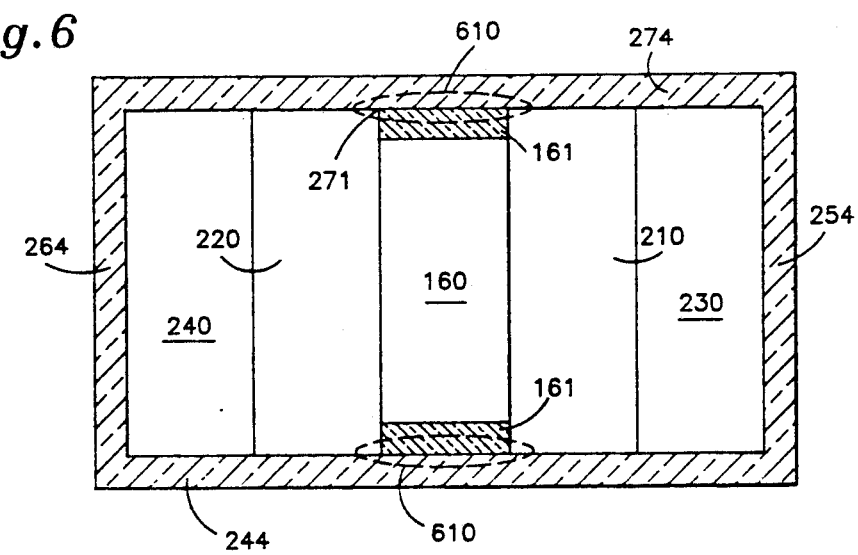
FIG. 6 illustrates a plan view of the mesa of FIG. 1.

In FIG. 6 there is shown a cross section in a plane through the top surface of gate 160. Two areas 161 are the vertical portions of the poly strip that forms gate 160. All around mesa 200 there is a rim that is the overlap area, comprising areas 244, 254, 264, and 274. The two dotted lines labelled 610 represent the area for the threshold implant described with respect to FIG. 5. Areas 610 will be referred to as the gate-sidewall transition areas or regions, since they are the places where the gate meets the sidewall and has a transition from the horizontal to the vertical. These regions extend under the field insulator structure 130 to allow for alignment tolerance and the possibility that charge influence will extend under the field insulator away from the sidewall.

The implant may be performed over a larger area, of course, but this area denoted as 610 is the weakest one, since the path between source and drain is more important than other regions of potential leakage. Areas 610 are most conveniently implanted before field insulator 130 as put down, but the doping may be done after aperture 180 is cut, with reliance on diffusion to cause the dopant to extend slightly under structure 130.

In the illustrative embodiment, a set of silicon mesas having a thickness of approximately 1500 Å, and having a protective oxide cover of 150 Å of oxide that also serves to scatter the sidewall implant and protect the underlying silicon are formed in a commercially available wafer, such as that available from Ibis Technology Corporation having a buried oxide layer approximately 3800 Å thick. The upper silicon layer may be reduced in thickness by oxide growth to achieve a desired initial thickness. The buried oxide thickness is not relevant to the invention.

After the sidewall implant and the transistor threshold adjust implant, the field insulator structure is fabricated. First about 400 Å of oxide 135 is grown. Since the buried oxide contains a considerable proportion of unreacted silicon, this layer will also grow somewhat. Next, a 2500 Å layer of boron phosphosilicate glass of conventional composition is deposited across the wafer, followed by a 1000 Å layer of undoped CVD oxide. Those skilled in the art may readily vary the field insulator layer to suit their requirements. An advantage of this configuration is that there is a weak point at the corners 253 in FIG. 2 where the poly gate passes over the thinner oxide at the corners that was present in prior art devices. With the present invention, the poly gate passes over the corners separated by a nominal thickness of between 3500 Å and 3900 Å of oxide in layers 140 and 150. Those skilled in the art would be reluctant to allow poly 160 to cross a higher step than the thickness of the mesa, since it is well known that the fewer and the smaller the steps, the better the yield. Preferably, the poly is doped when deposited to ensure good conductivity in the vertical portion that extends up the aperture walls. In the prior art of FIG. 4, the poly step from the mesa down to the buried field oxide was only the nominal mesa thickness of about 1500 Å. It has been found that the superior properties of field insulator 130 compensate for the additional step height.

In the case of mesas for N-channel transistors, the conventional dopant is boron, which is reduced in concentration during the oxidation process by escaping into the surrounding oxide regions and the atmosphere. The concentration reduction lowers the turn-on threshold for parasitic channels 420 and 440. With high temperature processing of layer 135, a thin layer of silicon in the overlap area and on the sidewalls adjacent to oxide 135 is somewhat depleted in boron because of this effect. The greater adjacent oxide volume in field structure 130 causes boron to segregate into it. That portion of layer 135 near corners 271, where it is exposed to charge collecting in sidewall 185, is thus a potential channel that has a lower threshold than is desired. The higher the temperature during oxidation, the more rapid the dopant depletion. It is an advantage of this process that the relatively low temperatures involved compared with prior art gate processing reduces the amount of boron depletion under gate 160. It is a further advantage that less boron escapes through corners 271 from the mesa under oxide 135 during the gate oxide processing.

Boron segregates by diffusing out of the silicon to a degree that depends on the temperature of the oxidation process. A temperature of 850° C is a dividing point for current technology where the deleterious effects of the low boron concentration become noticeable, but the development of technology will doubtless lower the temperature at which this surface effect is significant. A final set of process parameters results from tradeoffs, one of which is processing time versus dopant concentration.

The dopant concentration near the surface may be partially restored by diffusion from lower levels during subsequent high temperature steps. In the particular case of SOI, the mesas have less material that has not been depleted in dopant than do bulk processes. This problem becomes more severe as the mesa thickness decreases.

In the case of phosphorous dopants, the concentration becomes higher at a silicon-oxygen interface because the solubility of phosphorous is considerably less in oxide than in silicon. Parasitic transistor threshold under the field is not of concern for phosphorous doped P-channel devices because the parasitic threshold voltage magnitude increases as the surface concentration increases.

The changing concentrations at the surface will affect the transistor thresholds, however, and the threshold change will affect the circuit timing, since the turn-on time will be changed. The magnitude and direction of a threshold change will depend on the dopant species and transistor type, as well as the magnitude of the concentration change. For N-channel enhancement transistors having a boron dopant, a decrease in the concentration will decrease the threshold. For P-channel enhancement transistors having a phosphorus dopant, an increase in the dopant concentration will increase the threshold. Those skilled in the art will readily appreciate the effect of a concentration change on other types of transistors.

Approaches to maintaining the desired surface dopant concentration may involve additional doping steps to establish a concentration that will transform to the desired value after the high temperature steps have been completed and/or using low temperature processing to form the desired structure. For example, a surface implant of boron could be used, with a magnitude that will be reduced to the final value.

The drawback of the slow growth of thermal oxide layers is well known. Gate oxides grown entirely by a low temperature thermal process are not commercially acceptable. A method of forming an oxide layer according to the dry-wet or dry-wet-dry process has the substantial benefit of combining a low concentration of trapping sites from the dry step with reasonable speed from the pyrogenic step. As always, a production process will result from a complex set of tradeoffs. In rad-hard processing, a temperature of 850° C. is a conventional dividing point between the higher-defect high temperature regime and the lower-defect low temperature regime. The preferred compromise is to use a temperature of 825° C. for a dry-wet-dry gate oxide, together with a preimplant under the field structure and a threshold voltage adjust implant that allows for residual surface dopant concentration redistribution and/or segregation.

In addition to escape during the gate processing, there is an additional boron loss during the formation of oxide layer 135. A further option, therefore, is the use of the inventive process in the formation of layer 135. The use of low temperature dry thermal oxide suffers from the increase in processing time associated with a reduction in temperature. The use of the "dry-wet" or "dry-wet-dry" process to form the bottom layer of the field insulator structure 130 would raise the channel-formation threshold in overlap area 274 and sidewalls 272.

Although the process has been described with respect to a structure in which the field insulator overlaps the mesa, the benefits of reduced transistor leakage and more consistent dopant concentration apply to a more planar structure in which the field insulator is at the same height or even lower than the mesa top surface.

It should be noted that the invention is not limited to the particular embodiments shown and described herein, but that various changes and modifications may be made without departing from the spirit and scope of this novel concept.

What is claimed is:

1. An integrated circuit formed above a substrate having a buried insulator layer and a plurality of silicon mesas doped with an initial dopant polarity and concentration, each having a mesa sidewall and a mesa top surface, disposed above said buried insulator layer, comprising:

a field insulator structure, having at least two layers of insulating material, extending over said buried insulator layer and further extending up said mesa sidewalls and over said mesa top surface;

at least one aperture in said field insulator structure extending downwardly to said top surface of at least one of said mesas and exposing field aperture sidewalls in said field insulator structure, said aperture being positioned with respect to said mesa and having aperture dimensions such that said field insulator structure extends over an outer overlap region of said mesa, leaving an aperture portion of said mesa exposed by said aperture;

a polysilicon strip extending along a top surface of said field insulating structure and downward into said aperture and along said mesa top surface along a longitudinal axis, forming a transistor gate disposed above a transistor body region of said mesa having a predetermined dopant polarity and concentration of a first dopant, said doped polysilicon strip having a gate-sidewall transition region where said polysilicon strip bends upward along said field aperture sidewall from said gate;

a gate insulator layer between said gate and said mesa top surface;

a source and drain, having a predetermined source and drain dopant polarity and concentration of a second dopant, one of said first and second dopants being P-type and the other of said first and second dopants being N-type, and extending in said mesa parallel to said longitudinal axis throughout said aperture portion of said mesa, whereby said source and drain dopant polarity and concentration extend up to said aperture sidewalls, said source and drain forming a transistor with said gate, and not being ohmically connected to said transistor body region in said mesa below said gate, whereby said transistor body is floating and whereby no path extending in said aperture portion of said mesa between said floating body and either of said source and drain passes through a shorted P-N junction;

a gate-sidewall region in said mesa where said polysilicon strip extends downward to meet said mesa top surface at an intersection point displaced by a predetermined overlap distance from a nearest edge of said mesa, whereby a potential current path region having a current path threshold exists in said gate-sidewall region along said mesa surface between said source and said drain; and said mesa further includes an ion implant region extending over at least said gate-sidewall region and containing a predetermined ion concentration sufficient to raise said current path threshold to a predetermined current path threshold value.

2. An integrated circuit according to claim 1, in which said ion implant region extends downwardly through said mesa and outwardly to a nearest vertical mesa edge and has an ion implant concentration distribution such that said vertical mesa edge has an inversion threshold having a predetermined mesa edge inversion value.

* * * * *